(12) United States Patent
Chatellard et al.

(10) Patent No.: US 9,091,831 B2
(45) Date of Patent: Jul. 28, 2015

(54) RACK-MOUNTABLE TELECOMMUNICATIONS PATCH PANEL

(71) Applicant: 3M INNOVATIVE PROPERTIES COMPANY, St. Paul, MN (US)

(72) Inventors: Xavier Chatellard, Cluses (FR); Guy Metral, Cluses (FR)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 14/371,108

(22) PCT Filed: Jan. 22, 2013

(86) PCT No.: PCT/US2013/022454
§ 371 (c)(1),
(2) Date: Jul. 8, 2014

(87) PCT Pub. No.: WO2013/119379
PCT Pub. Date: Aug. 15, 2013

(65) Prior Publication Data
US 2015/0016796 A1    Jan. 15, 2015

(30) Foreign Application Priority Data

Feb. 7, 2012  (EP) .................................... 12154170

(51) Int. Cl.
*G02B 6/00*    (2006.01)
*H02B 1/26*    (2006.01)
*G02B 6/44*    (2006.01)
(Continued)

(52) U.S. Cl.
CPC ................ *G02B 6/4452* (2013.01); *H04Q 1/13* (2013.01); *H05K 7/1401* (2013.01); *H05K 7/1489* (2013.01); *Y10T 29/49947* (2015.01)

(58) Field of Classification Search
CPC ...... H05K 7/1489; H05K 7/01; H05K 7/1401
USPC ........................... 385/134, 135; 361/644–651
See application file for complete search history.

(56) References Cited

U.S. PATENT DOCUMENTS 6,926,378 B2 *    8/2005   Greenwald et al. ........ 312/334.4
2006/0018622 A1    1/2006   Caveney
(Continued)

FOREIGN PATENT DOCUMENTS

JP    08-168139 A       6/1996
JP    1998-61078    *   3/1998 ................ E04B 2/94
(Continued)

OTHER PUBLICATIONS

International Search Report for PCT/US2013/022454, mailed on Apr. 23, 2013, 3 pp.
(Continued)

*Primary Examiner* — Robert Tavlykaev
(74) *Attorney, Agent, or Firm* — Gregg H. Rosenblatt

(57) ABSTRACT

Telecommunications patch panel (10) comprising a mounting interface for mounting the patch panel (10) in a mounting location of a rack, wherein the mounting interface comprises fixation means (120) for suspending and securely fixing the patch panel (10) on the rack. The fixation means (120) is/are linearly movable, relative to the mounting interface, in a first direction between a first position and a second position, and in a second direction between the second position and a third position.

14 Claims, 6 Drawing Sheets

(51) Int. Cl.
*H04Q 1/02* (2006.01)
*H05K 7/14* (2006.01)

(56) References Cited

U.S. PATENT DOCUMENTS

| 2008/0115956 | A1 | 5/2008 | Donnell |
| 2010/0085726 | A1* | 4/2010 | Blomquist .................... 361/825 |
| 2010/0310225 | A1 | 12/2010 | Anderson |
| 2011/0221314 | A1 | 9/2011 | Korikawa |

FOREIGN PATENT DOCUMENTS

| JP | 2005-209388 A | 8/2005 |
| WO | 2010/080745 | 7/2010 |

OTHER PUBLICATIONS

Office Action for MX/a/2014/009280, mailed on Mar. 31, 2015, 3 pp.

* cited by examiner

RACK-MOUNTABLE TELECOMMUNICATIONS PATCH PANEL

CROSS REFERENCE TO RELATED APPLICATIONS

This application is a national stage filing under 35 U.S.C. 371 of PCT/US2013/022454, filed Jan. 22, 2013, which claims priority to European Patent Application No. 12154170.0, filed Feb. 7, 2012, the disclosure of which is incorporated by reference in its/their entirety herein.

BACKGROUND

The invention relates to a telecommunications patch panel that comprises a mounting interface for mounting the patch panel in a mounting location of a rack, and to a method of mounting a patch panel in a rack.

Patch panels are employed in telecommunication systems to enable fibre-optic or electrical interconnections to be changed as required. Typically, fibre-optic or electrical jacks are mounted on the patch panel, which are accessible from the front side of the patch panel, and into which so-called patch cords can be plugged as required. Patch panels are often arranged in racks so that the connectors on the front side of the panel are exposed and readily accessible. Normally, several patch panels are mounted in a rack in a space-saving manner, e.g. one above the other, with no free space between one patch panel and a patch panel above or below it.

Mounting racks mostly comprise two vertical parallel mounting posts with flat mounting surfaces oriented towards the front of the rack. Each mounting surface has a vertical row of mounting holes of standardized shapes and sizes, located at standardized intervals. A patch panel can be mounted on the rack by screws extending from the front through a mounting plate or mounting interface at both lateral sides of the patch panel and through corresponding mounting holes on the rack. For fixing the patch panel to the rack, an installer engages the screws with the mounting posts or with corresponding nuts, positioned behind the mounting holes.

Mounting a patch panel on a rack can be difficult for a single person, because the patch panel needs to be held in its mounting position with one hand, while the screws first on one side of the patch panel, then on the other side, are to be engaged with the other hand. If patch cords are already connected to the patch panel, the mounting is even more difficult, because one hand must carry the weight of the patch panel and the additional weight of the patch cords, while the other hand engages the screws. Unmounting of patch panels from a rack can be equally difficult, because the patch panel must be held with one hand while the screws must be removed with the other hand.

Traditional mounting of a patch panel is shown, for example, in the international patent publication WO 2010/080745, which describes a rack mounting bracket attached to a mounting portion of a side of a patch panel, and in U.S. patent publication 2008/0115956, in which a patch panel has a frame which has mounting members on opposite longitudinal ends of the frame for mounting the patch panel to a plurality of locations on a network rack using screws, that may be inserted through the mounting members and through mounting apertures in the rack in order to secure the patch panel to the rack. U.S. patent application 2006/0018622 A1 describes a patch panel which is pivotally mounted to a drawer. The drawer has a cable tray which in turn has retainer clips that allow the patch panel to move between an upright position and a rotated position.

Attempts have been made to make the mounting of patch panels in racks easier. JP 2005209388 A2 describes a patch panel frame which is mounted on a rack by using mounting screws. The mounting screws pass into fixing holes of the frame through vertical slits extending from the fixing holes. The mounting screws can receive a part of the weight of the patch panel frame while the mounting screws are not fully tightened. A patch panel that is to be mounted in a rack, can be brought into a suspended state in its final mounting location. In this suspended state, its weight is supported by the rack, so that an installer can use both hands to securely fix it to the rack, e.g. by tightening screws.

The mounting locations above or below the mounting location, in which a patch panel is to be installed, may be occupied by other patch panels or other equipment. Generally, free space or gaps above or below adjacent mounting locations are undesirable, because space in a rack is valuable. Hence, it is desirable that a patch panel, that is to be mounted in the rack, can be brought into a suspended state in its final mounting location without requiring free rack space above or below the space that the patch panel occupies in its final mounting location. The present invention addresses this problem.

SUMMARY

The present invention provides a telecommunications patch panel comprising a mounting interface for mounting the patch panel in a mounting location of a rack, wherein the mounting interface comprises fixation means for suspending and securely fixing the patch panel in the mounting location of the rack, characterized in that the fixation means is/are linearly movable, relative to the mounting interface, in a first direction between a first position and a second position, and in a second direction between the second position and a third position.

A patch panel according to the invention can be positioned in the rack in its mounting location without requiring free rack space above or below the space that the patch panel occupies in its final mounting location. In other words, it can be brought into its mounting location and positioned in its mounting location even if further patch panels are mounted above and below its mounting location without any free rack space between the patch panel and the patch panels above and below it. The patch panel can, for example, be suspended in the mounting location by moving the fixation means in the first direction from a first position into the second position, without having to move the patch panel upwards or downwards in the rack. The patch panel may be securely fixable to the rack, e.g. by moving the fixation means in the second direction from the second position into the third position without having to move the patch panel upwards, downwards or sideward in the rack.

The patch panel according to the invention comprises a mounting interface. The mounting interface may be connected with the patch panel. The mounting interface may be connected with the patch panel at a side of the patch panel. A patch panel may comprise two such mounting interfaces, one on each lateral side of the patch panel. The mounting interface may be adapted to engage with mounting holes, which holes may be arranged in mounting surfaces of a rack for mounting telecommunications equipment therein. The patch panel and/or the mounting interface may specifically be adapted to engage with mounting holes arranged in mounting surfaces of a standardized rack, like, for example, a standardized 19" rack according to the standard IEC 60297 of the International Electrotechnical Commission. The mounting holes may have a round shape or a rectangular or square shape. They may have a square shape wherein each edge of the square has a length of 0.375 inches. They may be arranged vertically in a row. They may be arranged in a row of repeating sets of three mounting holes, with center-to-center separations of 0.625 inches between mounting holes in the same set, and 0.5 inches between the closest mounting holes of adjacent sets. A set of three mounting holes may define a mounting location of a patch panel. A mounting location of a patch panel is a position of the patch panel in a rack in which the patch panel is when it is mounted and securely fixed in the rack via mounting holes. A patch panel can be in a mounting location, independent of whether it is fixed or not, suspended or not, or manually supported or not.

The mounting interface of the patch panel of the present invention comprises fixation means for suspending and securely fixing the mounting interface to the rack. Suspension of the patch panel on the rack provides support for the patch panel in that its weight is supported and in that it remains in place if no additional forces are applied. In a suspended state, the patch panel may still be movable relative to the rack. In a suspended state, the patch panel may not be securely fixed to the rack. The fixation means may comprise a hook. The hook may make the fixation means suitable for suspending the patch panel to the rack. The fixation means may comprise two or more hooks that may make the fixation means suitable for suspending the patch panel to the rack.

The fixation means is suitable for securely fixing the patch panel to the rack. Secure fixing of the patch panel on the rack provides support for the patch panel in that its weight is supported and in that it is securely fixed to the rack such that the patch panel cannot be moved any longer relative to the rack, even if additional forces are applied to the patch panel. In particular, after securely fixing, i.e. in the fixed state, the patch panel cannot be removed from the rack, unless the fixation means is released. The fixation means may be releasable.

The fixation means is/are movable relative to the mounting interface. This is to be understood such that the fixation means is/are movable relative to at least one other part of the mounting interface. The fixation means may be movable relative to a part of the mounting interface, which connects the mounting interface to another part of the patch panel, e.g. a part which connects the mounting interface to a front surface of the patch panel. The fixation means may be linearly and/or rotationally movable relative to the mounting interface.

The mounting interface of the patch panel according to the invention may comprise a fixed part and a part that is movable relative to the fixed part. The fixed part may be connected to a front plate of the patch panel. The movable part comprises the fixation means for suspending and securely fixing the patch panel on the rack. The fixed part may be shaped suitably to rest against a mounting surface of a rack, when the patch panel is in a mounting location. The fixed part may comprise an interface block assembly. The interface block assembly may comprise a rear surface that is adapted to rest against a mounting surface of a rack, when the patch panel is in a mounting location. The interface block assembly may generally envelope the fixation means. The interface block assembly may comprise a polymeric material or metal. The interface block assembly may have an opening through which a part of the fixation means may protrude. A protrusion of the fixation means may be adapted to engage with a mounting hole of the rack such that the patch panel can be suspended and/or securely fixed in the mounting location of the rack, when the patch panel is in a mounting location. A protrusion of the fixation means may be hook-shaped.

The fixation means may have a threaded opening. The mounting interface may comprise a threaded element, e.g. a screw, that can engage with the threaded opening.

The fixation means is movable between a first position and a second position. It may be linearly movable between the first position and the second position The first position may be an idle position, in which, when the patch panel is arranged in the mounting location, the fixation means is not engaged with the rack, such that the patch panel can be removed from the rack. In this position of the fixation means, the patch panel may be removable from the rack manually.

The second position may be a suspension position in which, when the patch panel is arranged in the mounting location, the fixation means is engaged with the rack such that the patch panel is suspended on the rack in the mounting location. When the patch panel is suspended on the rack, the weight of the patch panel is supported by the rack. When the fixation means is in the suspension position, the patch panel may not be securely fixed to the rack, i.e. the patch panel may still be movable relative to the rack.

The first direction may be a horizontal or a vertical direction. The first direction may be a horizontal or a vertical direction relative to the mounting interface, when the patch panel is positioned in a mounting location of a rack. The second position of the fixation means may be located above or below the first position, when the patch panel is arranged in the mounting location.

The fixation means is movable between the second position and the third position. It may be linearly movable between the second position and the third position. The third position may be a fixation position, in which, when the patch panel is arranged in the mounting location, the fixation means securely fixes the patch panel to the rack. In this third position, the fixation means may be engaged with the rack such that the patch panel is securely fixed in the mounting location of the rack.

The second direction may be a vertical or a horizontal direction. The second direction may be a vertical or a horizontal direction relative to the mounting interface, when the patch panel is positioned in a mounting location of a rack. Specifically, the second direction may be a forward/rearward horizontal direction relative to the mounting interface, when the patch panel is positioned in a mounting location of a rack. The forward-rearward direction may be a direction generally parallel to a surface normal of a front surface of the patch panel. The second position may be located rearward from the third position.

The fixation means may be movable manually. This may be advantageous in that no tools may be required to move the fixation means. It may also allow to move the fixation means with the same hand that supports some or all of the weight of the patch panel.

The fixation means may comprise a hook-shaped part or two hook-shaped parts. A hook-shaped part may be adapted to engage with an edge of an opening in the rack. This may allow for a particularly simple design of the mounting interface of the present invention.

The mounting interface may comprise a spring or another type of resilient element. The fixation means may be movable against the force of the spring or of the resilient element. The spring or the resilient element may define a stable position of the fixation means relative to other parts of the mounting interface or to the patch panel, in respect to which the fixation means is movable. It may also prevent undesired or accidental movement of the fixation means out of a stable position. The spring or the resilient element may be movable with the fixation means relative to other parts of the mounting interface or relative to the patch panel, or it may be fixed relative to the patch panel.

The first direction may be perpendicular to the second direction. The first or the second direction may be a direction parallel to a front surface of the patch panel. The first or the second direction may be a direction perpendicular to a front surface of the patch panel. The first or the second direction may be a direction parallel to a height direction of a rack, to which the patch panel is to be fixed. Movement in the first direction may be independent from movement in the second direction. The ability of movement in two directions perpendicular to each other is advantageous in that movement in one direction can be used to achieve a first mechanical effect, like, for example, the suspension of the patch panel, while movement in the other direction can be used to obtain a second, independent, mechanical effect. The second effect may, for example, be the secure fixing of the mounting interface and of the patch panel to the rack.

The mounting interface may comprise a threaded element. By turning the threaded element, the fixation means may be movable, relative to the mounting interface. The fixation means may be movable in the first direction or in the second direction by turning the threaded element. The fixation means may be linearly movable in the first direction or in the second direction by turning the threaded element. The threaded element may be, for example, a screw or a threaded pin. The fixation means may be movable into the third position by turning the threaded element. The fixation means may be movable into the third position by turning the threaded element clockwise. A threaded element is advantageous in that it may be able to transmit an appropriate force to securely fix the patch panel to the rack by moving the fixation means, e.g. by moving the fixation means into a fixation position.

The fixation means may be adapted to securely fix the patch panel to the rack by clamping a part of the rack between the fixation means and another part of the mounting interface. Clamping is a particularly simple mechanism of fixing the patch panel. Clamping in general may require only a small movement of a clamping element to securely fix the mounting interface and the patch panel connected with it, or to release the mounting interface or the patch panel from the rack.

The mounting interface or the interface block assembly may comprise positioning means for positioning the patch panel in a mounting location of a rack. The positioning means may facilitate positioning when the patch panel is moved into the mounting location. The positioning means may comprise a protrusion. The protrusion may protrude from the mounting interface or from the interface block in a rearward direction. The positioning means may be shaped and located suitably for being inserted into a mounting hole of the rack in such a way, that the fixation means is guided into a position in which it is engageable with a mounting hole of the rack such that the fixation means suspends and/or securely fixes the patch panel to the rack. The positioning means may, for example, be a positioning pin, that is adapted to protrude into an opening in the rack on which the patch panel and the mounting interface is to be mounted.

The positioning means may be resilient. The positioning means may have a retention element. The retention element may be adapted to engage with a part of the rack, in which the patch panel is to be mounted. The retention element may be adapted to latch behind an edge of a mounting hole of the rack. The retention element may prevent accidental movement of the mounting interface, once the patch panel is in a mounting location and the patch panel is neither suspended nor fixed on the rack. Positioning means on the mounting interface of the present invention may facilitate precise positioning of the patch panel relative to the rack and may thus avoid the need for further movement of the patch panel in its mounting location or for removal and repositioning of the patch panel due to incorrect positioning.

The mounting interface may be adapted to suspend and securely fix the patch panel in a mounting location of a standardized 19-inch rack. This increases the versatility of the patch panel, because it permits mounting of the patch panel in different racks of the 19-inch standardized type.

The invention also provides a method of mounting a telecommunications patch panel in a mounting location of a rack, comprising, in this sequence, the steps of a) providing a rack comprising a mounting location for a patch panel;

b) providing a telecommunications patch panel as described above;

c) arranging the patch panel in the mounting location of the rack;

d) moving the fixation means in the first direction from the first position into the second position; and e) moving the fixation means in the second direction from the second position into the third position.

Step d) may be done manually or using a tool. Step e) of moving the fixation means into the fixation position may be done by turning a threaded element that may be comprised in the mounting interface. Step e) may be done manually or using a tool.

In the method described above, the first position may be an idle position, in which, when the patch panel is arranged in the mounting location, the fixation means is not engaged with the rack, such that the patch panel can be removed from the rack.

In the method described above, the second position may be a suspension position, in which, when the patch panel is arranged in the mounting location, the fixation means is engaged with the rack such that the patch panel is suspended on the rack in the mounting location. The second position may be a position in which the patch panel may not be securely fixed to the rack.

In a method as described above, the third position may be a fixation position, in which, when the patch panel is arranged in the mounting location, the fixation means securely fix(es) the patch panel in a mounting location of the rack.

BRIEF DESCRIPTION OF THE DRAWINGS

The invention will now be described in more detail with reference to the following Figures exemplifying particular embodiments of the invention.

DETAILED DESCRIPTION

Figure 1:
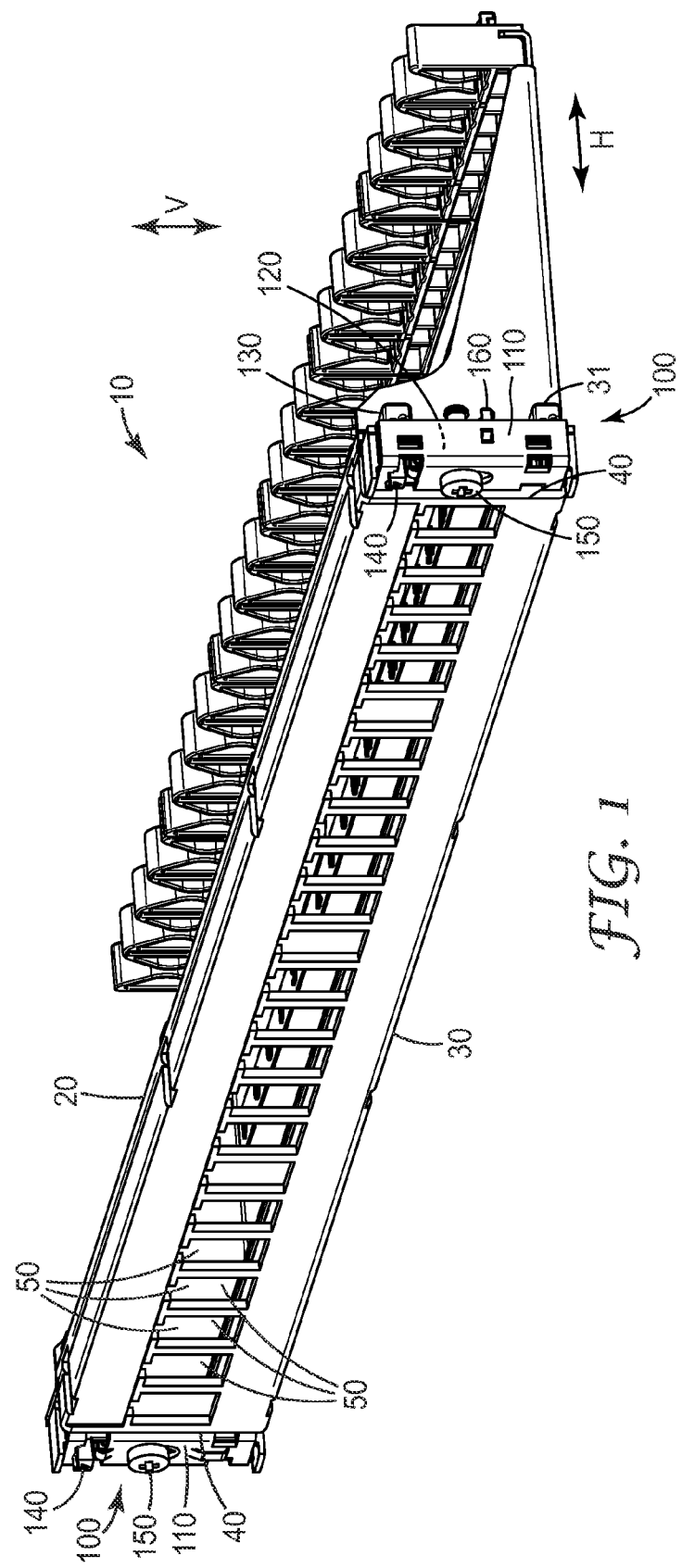
FIG. 1 Perspective view of a patch panel according to the present invention, comprising two mounting interfaces.

Herein below various embodiments of the present invention are described and shown in the drawings wherein like elements are provided with the same reference numbers.

In FIG. 1, a front surface of a telecommunications patch panel 10 according to the invention is shown in a perspective view. The patch panel 10 has a top edge 20, a bottom edge 30, and two side edges 40. The patch panel 10 comprises a horizontal row of openings 50, in which electrical or fibre-optic telecommunication jacks can be mounted. Corresponding mating electrical connectors or mating fibre-optic connectors of patch cables can be inserted into these jacks. On each lateral side, the patch panel 10 comprises a mounting interface 100. Each of the mounting interfaces 100 serves to mount the patch panel 10 in a mounting location of a rack. Each mounting interface 100 is fixedly connected to the patch panel 10 in that the front plate of the patch panel 10 extends to form a part of the mounting interfaces 100. The mounting interfaces 100 on each side of the patch panel 10 are identical, except for one being mirrored horizontally, i.e. right-left, with respect to the other. Each mounting interface 100 comprises an interface block assembly 110 and a hooked bracket 120, which is movable relative to the interface block assembly 110. The hooked bracket 120 is a fixation means for suspending and securely fixing the mounting interface 100 and the entire patch panel 10 to the rack. The hooked bracket 120 comprises an upper hook 130, a lower hook 131 and an actuator 140. In an orientation of the patch panel 10 as mounted in the rack, the upper hook 130 is arranged above the lower hook 131. In an orientation of the patch panel 10 as mounted in the rack, the upper hook 130 and the lower hook 131 protrude towards the rear. The actuator 140 protrudes towards the front, in order to be accessible to an installer. In FIG. 1, only the two hooks 130, 131 and the actuator 140 of the mounting interface 100 on the right side of the patch panel 10 are visible. The interface block assembly 110 is a fixed part of the mounting interface 100, which is fixedly connected to the patch panel 10. The hooked bracket 120 is movable relative to the interface block assembly 110 and hence relative to the mounting interface 100. The hooked bracket 120 is movable, relative to the mounting interface 100 both in a vertical and, independently, in a horizontal direction, indicated by respective arrows "V" and "H". It can be moved manually in the vertical direction, relative to the interface block assembly 110, via the actuator 140, which is connected to the hooked bracket 120. The actuator 140 extends through an opening in the interface block assembly 110 and protrudes from the interface block assembly 110 towards the front of the mounting interface 100. The hooked bracket 120 is also movable in a horizontal direction, which is perpendicular to the front surface of the patch panel 10, i.e. in a "forward-rearward" direction, indicated by arrow "H". The hooked bracket 120 can be moved, relative to the interface block assembly 110, in the horizontal direction "H" by turning a tightening screw 150. The thread of the tightening screw 150 is engaged with a corresponding thread in the hooked bracket 120. The tightening screw 150 is connected with the hooked bracket 120 via the corresponding threads. The tightening screw 150 moves vertically as the hooked bracket 120 moves vertically. The tightening screw 150 can thus move relative to the interface block assembly 110. The head of the tightening screw 150 rests on an outer front surface of the interface block assembly 110, so that, by turning the tightening screw 150 in a clockwise direction, i.e. by tightening it, the hooked bracket 120 is pulled in the horizontal direction "H" towards the front, relative to the interface block assembly 110. Likewise, by turning the tightening screw 150 in an anti-clockwise direction, i.e. by untightening or releasing it, the hooked bracket 120 is pushed away from the front and moves towards the rear, relative to the interface block assembly 110.

The interface block assembly 110 further comprises a positioning pin 160, which facilitates vertical and lateral positioning of the mounting interface 100 in a mounting location of a rack in which the patch panel 10 is to be mounted. The engagement of the mounting interface 100 with a rack will be described in detail below.

For mounting the patch panel 10 in a mounting location of a rack, the patch panel 10 is, in a first step, positioned in the mounting location with the help of the positioning pins 160, while the hooked bracket 120 is in a first position, namely a vertically upper position, and the tightening screw 150 is not tightened. The upper hook 130, the lower hook 131 and the positioning pin 160 protrude, in this first position of the hooked bracket 120, into mounting holes of the rack without engaging with the rack. In a second step, the hooked bracket 120 is manually moved into a second position, which is a vertically lower position, by pushing the actuator 140 downwards. In this second, lower position, the hooks 130, 131 engage with the rack adjacent to the mounting holes, into which the hooks 130, 131 protrude, in such a manner that the hooks 130, 131 support the patch panel 10 and carry its weight, so that the installer does not need to hold the patch panel 10 with his hands. In a third step, the installer turns the tightening screw 150 in a clockwise direction. This moves the hooked bracket 120 towards the front against a rear surface of the interface block assembly 110, until a part of the rack adjacent the respective mounting holes, with which the hooks 130, 131 engage, is clamped tightly between the hooks 130, 131 and the rear surface of the mounting block 110. The hooked bracket 120 is then in a third position. By turning the tightening screws 150 of the left and the right mounting interfaces 100 of the patch panel 10 sufficiently in a clockwise direction, the hooks 130, 131 clamp the mounting interface 100 strongly around a part of the rack adjacent the mounting holes. This securely fixes the patch panel to the rack.

The mounting interfaces 100 will be explained in more detail in the following figures.

The FIGS. 2 to 7 will now be described with reference to the mounting interface 100 on one side (the right side in FIG. 1) of the patch panel 10. The patch panel 10 of the embodiment described in FIGS. 1 to 7 is to be fixed with two mounting interfaces 100, wherein the mounting interface 100 connected with the patch panel on the opposite side (the left side in FIG. 1) of the patch panel 10 is identical to the mounting interface 100 on the one side, except for being appropriately mirrored left-right. So elements corresponding to the ones described for the mounting interface 100 on the one side are present on the mounting interface 100 on the opposite side, and a step corresponding to one described for the mounting interface 100 on the one side is performed on the mounting interface 100 of the other side at the same time or directly afterwards. Such corresponding elements and such corresponding steps are in general only described for the mounting interface 100 on the right side of the patch panel 10 in FIG. 1.

Figure 2:
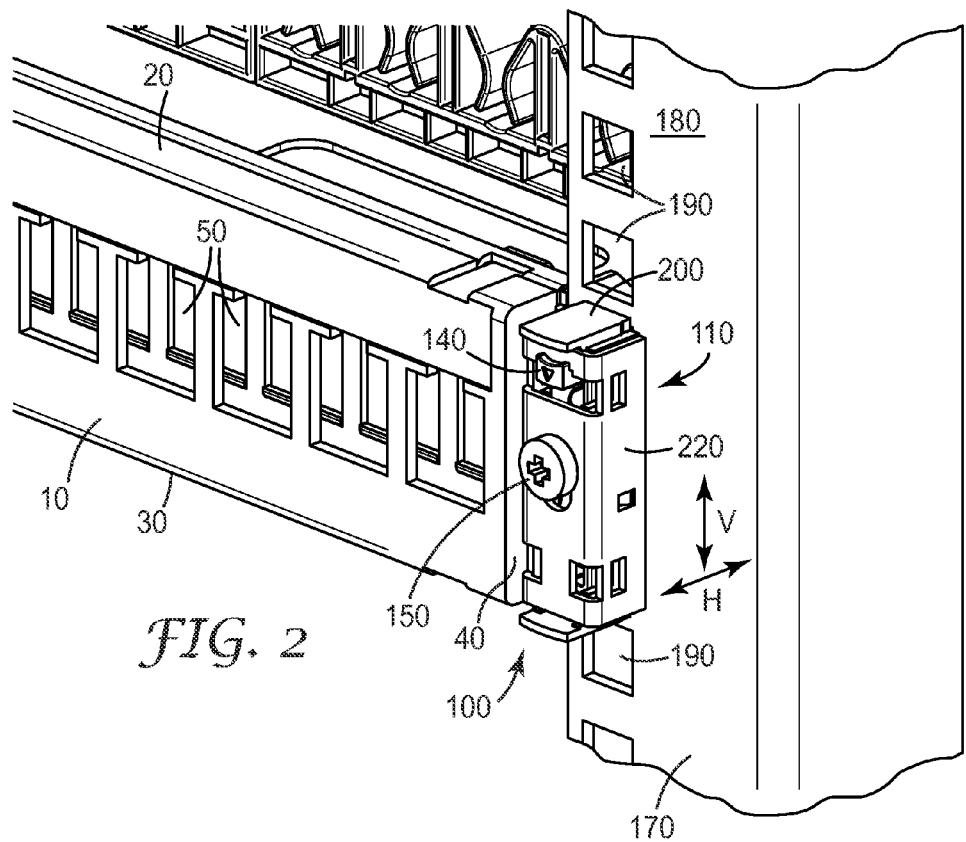
FIG. 2 Perspective front view of the patch panel and of one of the mounting interfaces of FIG. 1 in a mounting location of a rack.

FIG. 2 is a front perspective view of the patch panel 10 and the right-side mounting interface 100 of FIG. 1, ready for engagement with a mounting post of a rack. The mounting post 170 has a rectangular profile, forming two surfaces. One of the surfaces is a mounting surface 180, which faces towards the front. The mounting surface 180 comprises a vertical row of rectangular mounting holes 190, which can be used to mount equipment in the rack, e.g. to mount a patch panel 10 in the rack.

The interface block assembly 110 comprises an interface block 200 and a block support 220, to which the interface block 200 is fixedly connected. The interface block 200 extends vertically in the block support 220. The interface block 200 has a rear surface 210 (not visible in FIG. 2) which rests against the mounting surface 180 of the mounting post 170. The interface block 200 is, in the embodiment shown, made of a polymeric material, but it might alternatively be made of metal or any other suitable material. The interface block 200 generally envelopes the hooked bracket 120, which is movable relative to the interface block 200 in a horizontal direction "H" and in a vertical direction "V", as explained above.

The patch panel 10 is shown positioned in a mounting location of the rack. The mounting location is defined by a set of three adjacent mounting holes 190, which are covered by the mounting interface 100, and by a corresponding set of three adjacent mounting holes 190 in an opposed mounting post (not visible in FIG. 2), to which the other side of the patch panel 10 is fixed. This mounting location of the patch panel 10 in the rack is the position in which the patch panel 10 is when it is securely fixed to the rack. FIG. 2 shows the actuator 140 of the fixation means, i.e. of the hooked bracket 120, in an upper position. The tightening screw 150 has been turned anti-clockwise, so that it is not tightened and the hooked bracket 120 is pushed towards the rear, relative to the interface block 200. In this position of the actuator 140 and of the tightening screw 150, the hooked bracket 120 is in an idle position, in which the hooked bracket 120 is not engaged with the mounting post 170 of the rack. In this position of the hooked bracket 120, the rack does not support the weight of the patch panel 10 via the mounting interface 100. The patch panel 10 is held in this position manually, e.g. by an installer (not shown). In this position of the hooked bracket 120, the patch panel 10 is neither suspended nor securely fixed on the rack by the hooked bracket 120.

Figure 3:
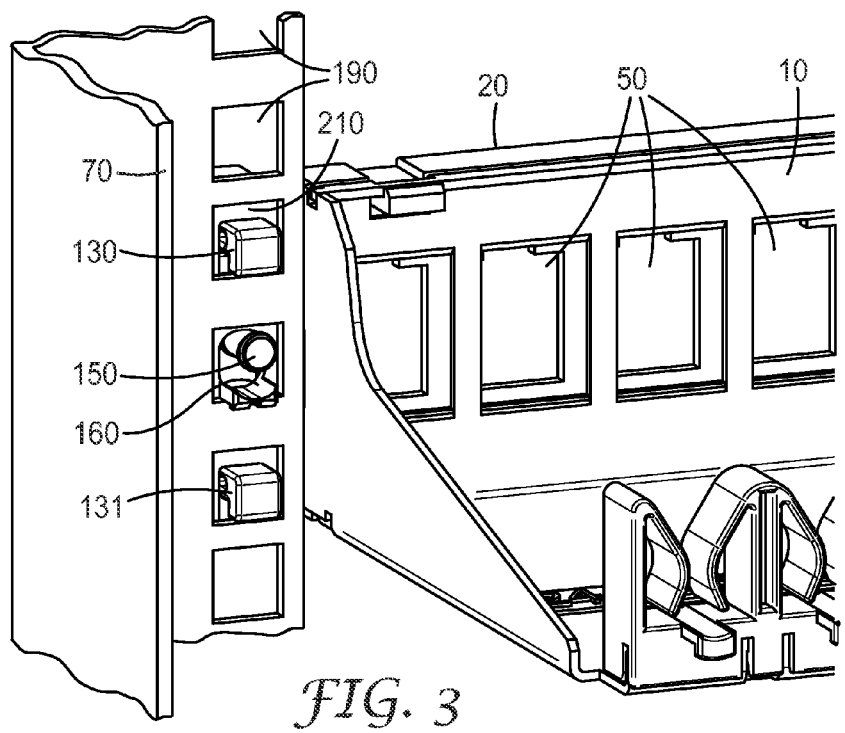
FIG. 3 Perspective view of the mounting interface of FIG. 2, seen from the rear.

In the perspective view of FIG. 3, the mounting interface 100 of FIG. 2 is shown as seen from the rear. The patch panel 10 is in the same position as in FIG. 2, i.e. in the mounting location. The positioning pin 160 rests on the lower edge of the mounting hole 190 into which it protrudes. It thereby defines the vertical position of the patch panel 10 relative to the rack in the mounting location. The positioning pin 160 is almost as wide as the lower edge of the mounting hole 190 into which it protrudes. It thereby defines the lateral position of the patch panel 10 relative to the rack in the mounting location. The rear surface 210 of the interface block 200 rests against the mounting surface 180 of the rack mounting post 170, thereby defining the horizontal, forward-rearward, position of the patch panel 10 relative to the rack in the mounting location.

The upper hook 130 and the lower hook 131 of the hooked bracket 120 protrude towards the rear into respective mounting holes 190 of the rack. The hooked bracket 120 is in the first position, i.e. in the idle position, as in FIG. 2, with the actuator 140 being in the upper position and the tightening screw 150 not tightened. In this idle position, the hooks 130, 131 of the hooked bracket 120 do not touch the mounting post 170 of the rack and are not engaged with it. As explained in the context of FIG. 2, the rack does not support the weight of the patch panel 10 via the mounting interface 100, and the patch panel 10 is neither suspended nor securely fixed on the rack by the hooked bracket 120, in this idle position of the hooked bracket 120.

Figure 4:
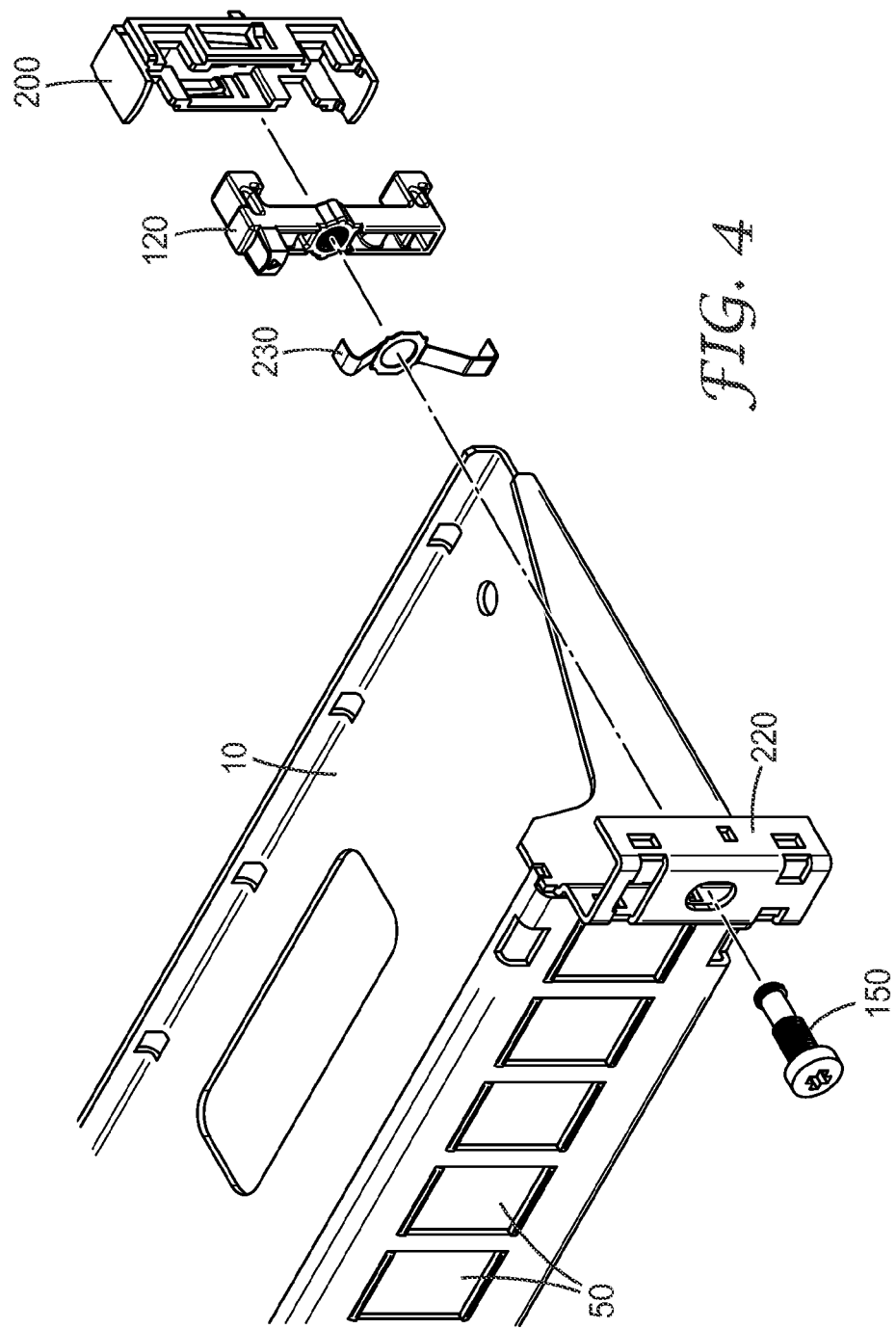
FIG. 4 Exploded view of the mounting interface of FIG. 2.

FIG. 4 is an exploded view of the mounting interface 100. The block support 220 is formed by a lateral extension of the front plate of the patch panel 10. The block support 220 has a U-shaped profile, so that it can accommodate a spring 230, the hooked bracket 120, and the interface block 200. The tightening screw 150 protrudes through an opening in the block support 220 and through an opening in the spring 230. A threaded portion of the tightening screw 150 is engaged with a corresponding inner thread in the hooked bracket 120. The tightening screw 150 extends further through an opening in the interface block 200. When the tightening screw 150 is turned clockwise, its head rests against the front surface of the block support 220, and the hooked bracket 120 is pulled, via its inner thread, towards the block support 220, against the force of the spring 230.

The spring 230 is engaged with the hooked bracket 120 and moves vertically with the hooked bracket 120. The interface block 200 is fixedly connected with the block support 220 via resilient portions of the interface block 200, that can engage with corresponding recesses in the block support 220 such as to form a clip connection. When the hooked bracket 120 is moved in a horizontal direction H or vertical direction V, the spring 230 and the tightening screw 150 move with the hooked bracket 120. The hooked bracket 120 is movable relative to the interface block 200 and to the block support 220. In other words, it is movable relative to the mounting interface 100.

Figure 5:
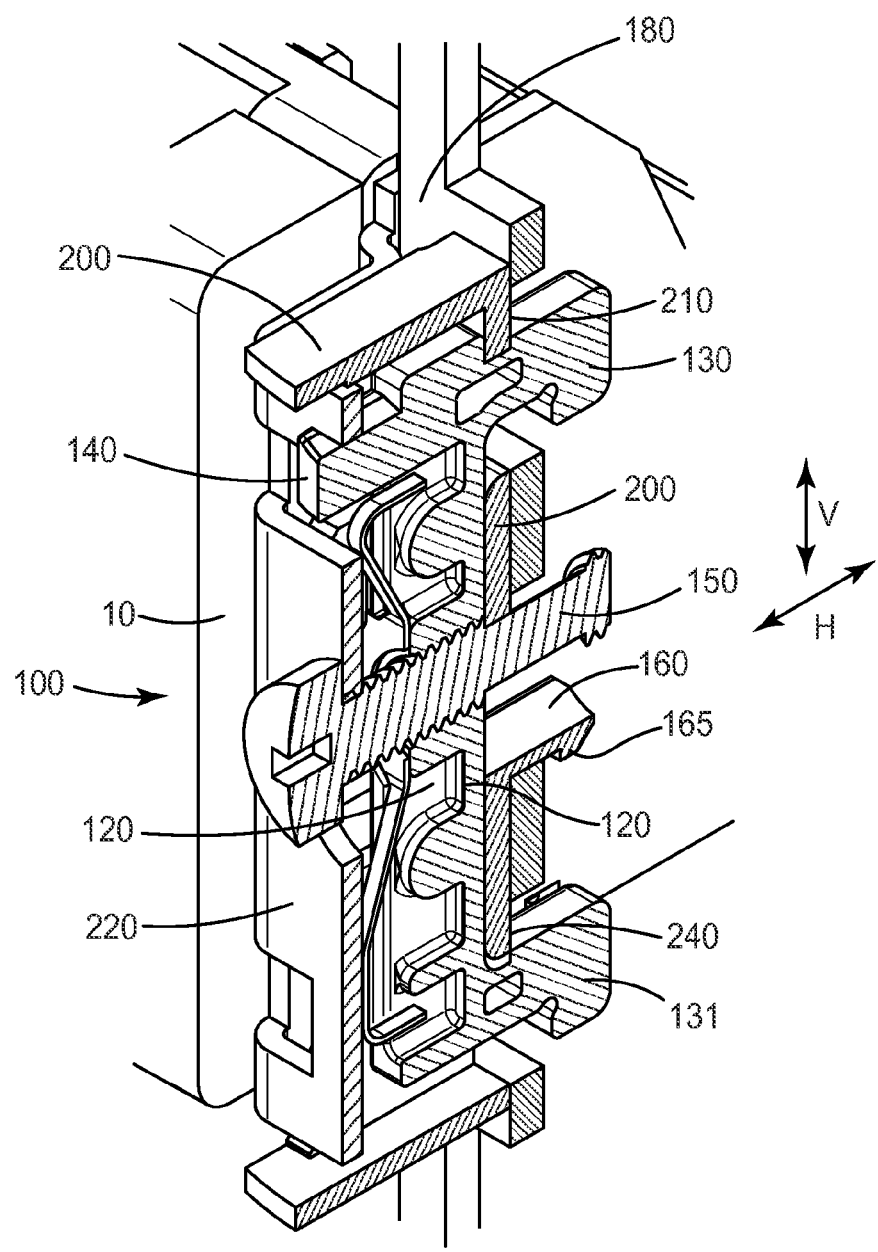
FIG. 5 Sectional perspective view of the mounting interface of FIG. 2, with the fixation means in a first position.

FIG. 5 is a sectional perspective view of the mounting interface 100 of FIGS. 2, 3 and 4. The patch panel 10 is in the same mounting location as shown in FIGS. 2 and 3. The hooked bracket 120 is in the same idle position as in FIGS. 2 and 3, i.e. in the first position, with the actuator 140 in the upper position. The hooks 130, 131 of the hooked bracket 120 protrude into respective mounting holes 190, but they do not touch or engage with the mounting post 170. Still, the rack does not support the weight of the patch panel 10 via the mounting interface 100, and the patch panel 10 is neither suspended nor securely fixed on the rack by the hooked bracket 120. The positioning pin 160 rests on the lower edge of the mounting hole 190 into which it protrudes. In the embodiment shown in FIGS. 1 to 7, the positioning pin 160 is made from a polymeric material. It is not strong enough to reliably support the weight of the patch panel 10. The positioning pin 160 has a retention element. The retention element is a nose 165, arranged close to the rearward end of the positioning pin 160. The nose 165, protrudes slightly downwardly. The positioning pin 160 is resilient, so that the patch panel 10 can be pushed manually into its mounting location in a purely horizontal movement, i.e. even when the mounting locations above and below its own mounting location in the rack are occupied by other patch panels. When pushing the patch panel 10 into its mounting location, the nose 165 will slide above the lower edge of the mounting hole 190 into which the positioning pin 160 protrudes, so that the rearward end of the positioning pin 160 is slightly lifted and thereby slightly bent upwards. Once the nose 165 has passed above the lower edge of the mounting hole 190, the positioning pin 160 will return to its normal, unbent shape. The nose 165 forms a minor barrier against the installer accidentally moving the mounting interface 100 away from the mounting surface 180 of the rack, while he attempts to manually hold the patch panel 10 in place in the mounting location of the patch panel 10 in the rack. When the patch panel 10 is in its mounting location, the rear surface 210 of the interface block 200 rests against the mounting surface 180 of the mounting post 170.

Figure 6:
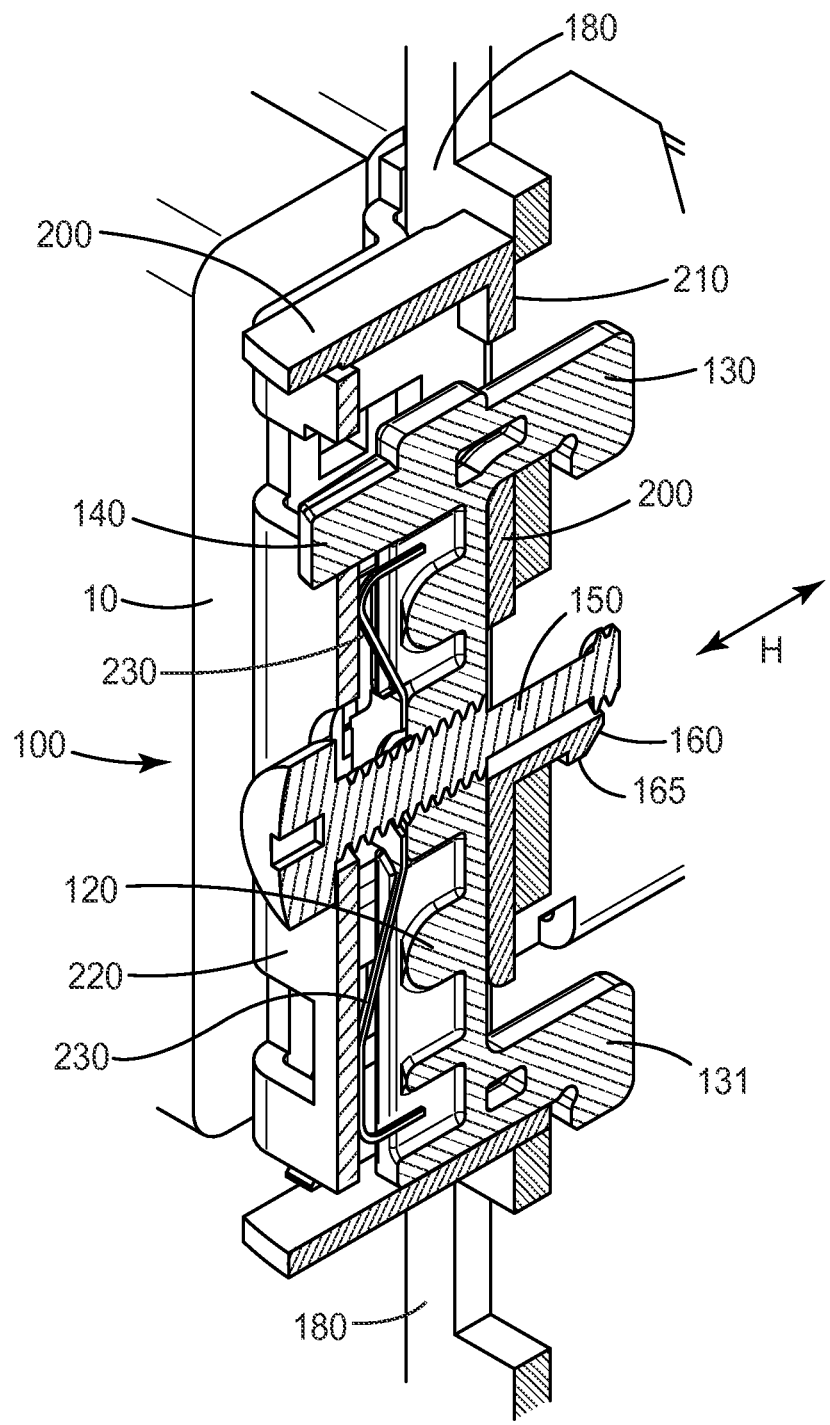
FIG. 6 Sectional perspective view of the mounting interface of FIG. 2, with the fixation means in a second position.

FIG. 6 is a sectional perspective view of the mounting interface 100 of FIGS. 2 to 5. The patch panel 10 is in the same mounting location as shown in FIGS. 2 to 4. As opposed to FIG. 5, the hooked bracket 120 is in the second position, i.e. the suspension position, with the actuator 140 in the lower position and with the tightening screw 150 not tightened. While the positions of the patch panel 10 and of the mounting interface 100 as such have not changed, the hooked bracket 120 has been lowered, i.e. moved vertically downward, relative to the interface block assembly 110, and thereby also relative to the rest of the mounting interface 100 and relative to the patch panel 10. In this second, vertically lower, "suspension" position of the hooked bracket 120, the upper hook 130 grips behind the lower edge of the mounting hole 190 into which it protrudes and engages with the mounting post 170 of the rack. Similarly, the lower hook 131 grips behind the lower edge of the mounting hole 190 into which it protrudes and engages with the mounting post 170 of the rack. The lower surfaces of the hooks 130, 131 rest on the lower edges of the respective mounting holes 190 into which they protrude. The spring 230 is connected with the hooked bracket 120 and is movable, together with the hooked bracket 120, in the interface block 200. The spring 230 forces the hooked bracket 120 rearward relative to the interface block assembly 110, as long as the tightening screw 150 is not tightened against the force of this spring 230. This makes the hooks 130, 131 protrude rearward from the interface block assembly 110. This, in turn, facilitates engagement of the hooks 130, 131 with the lower edge of the mounting holes 190, when the hooked bracket 120 is moved from the first position into the second position. The weight of the patch panel 10 is, in this suspension position of the hooked bracket 120, supported by the rack via the hooks 130, 131. The hooks 130, 131, in this second, suspension position of the hooked bracket, also prevent the patch panel 10 from tilting towards the front and accidentally falling or slipping out of the rack. A resilient part of the interface block 200 engages with the hooked bracket 120 such as to prevent the hooked bracket 120 to return from the second position into the first position under the weight of the patch panel 10.

In the second, suspension position of the hooked bracket 120, the patch panel 10 is not securely fixed to the rack in its mounting location. It can move a small distance in a forward-rearward direction "H" relative to the rack. This is because a horizontal gap exists between the part of the hooks 130, 131 gripping behind the lower edges of the respective mounting holes 190 and the lower edges of these mounting holes 190 themselves. The hooks 130, 131 do not clamp the lower edges of the respective mounting holes 190. The patch panel 10 is thereby suspended in its mounting location in the rack, but not securely fixed to the rack. In this second, suspension position, an installer does not need to hold the patch panel 10 manually, because its weight is supported by the rack via the hooks 130, 131 of the hooked bracket 120.

Figure 7:
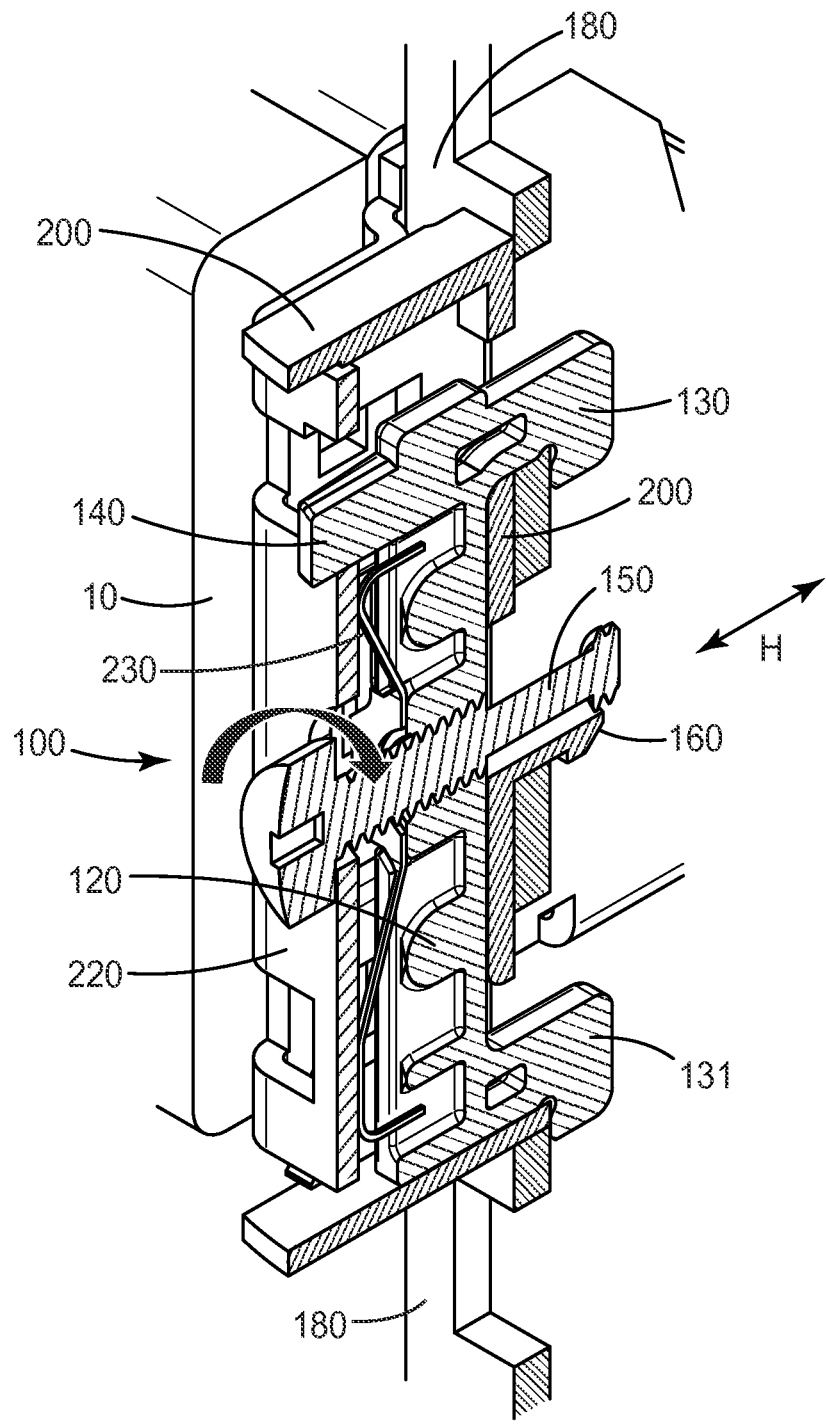
FIG. 7 Sectional perspective view of the mounting interface of FIG. 2, with the fixation means in a third position.

FIG. 7 is a further sectional perspective view of the mounting interface 100 of FIGS. 2-6. In FIG. 7, the tightening screw 150 has been turned clockwise sufficiently, so that the hooked bracket 120 is pulled back, against the force of the spring 230, towards the front, relative to the interface block assembly 110. The hooked bracket 120 has thereby been moved linearly in a horizontal direction from the second position into a third position, a fixation position. By tightening the tightening screw 150, the hooked bracket 120 is pulled back far enough for the hooks 130, 131 to firmly clamp the lower edge of the respective mounting holes 190, into which they protrude and with which they engage. The lower edges of the respective mounting holes 190 are clamped between the hooks 130, 131 and the rear surface 210 of the interface block 200. By turning the tightening screw 150 clockwise, i.e. by tightening it, the hooks 130, 131 are pulled towards the interface block 200, with the lower edges of the respective mounting holes 190 firmly clamped between the hooks 130, 131 and the interface block 200. Thereby the mounting interface 100 is securely fixed to the mounting post 170 of the rack. Thereby, the patch panel 10 is securely fixed on the rack. When the tightening screw 150 has been tightened, the hooked bracket 120 is not movable in a vertical direction V.

Generally, it should be noted that once the patch panel 10 has been brought into its mounting location in a rack, it is not required to move the patch panel 10 relative to the rack in order to have its weight supported by the rack via the mounting interface 100. Rather, it is sufficient to move the hooked bracket 120 vertically from the first, vertically upper position, the "idle" position, shown in FIG. 5, into the second, vertically lower, "suspension" position, shown in FIG. 6. Similarly, it is not required to move the patch panel 10 relative to the rack in order to securely fix it to the rack. Rather, it suffices to move the hooked bracket 120 horizontally from the second position, the "suspension" position, into the third position, the "fixation" position, shown in FIG. 7, by turning the tightening screw 150 sufficiently clockwise. The patch panel 10 can thus be positioned, suspended and securely fixed on the rack, even if other patch panels or other pieces of equipment occupy the mounting locations directly above and directly below the mounting position for the patch panel 10 to be newly mounted.

Unmounting of a securely fixed patch panel 10 from its mounting location in a rack can be achieved by performing the steps described above in reversed order, and on both mounting interfaces 100 on the two lateral sides of the patch panel 10. The patch panel 10 is thus unmounted by turning the tightening screw 150 anti-clockwise, thereby pushing the hooked bracket 120 horizontally rearward and away from the interface block 200. This releases the firm clamping of the lower edge of the mounting holes 190 between the respective hooks 130, 131 and the rear surface 210 of the interface block 200. The hooked bracket 120 is then in the suspension position, in which the weight of the patch panel 10 is supported by the rack via the hooked bracket 120, and in which the patch panel 10 is movable in a forward-rearward direction "H" by a small distance. The hooked bracket 120 can then be brought into the idle position by moving the actuator 140 vertically into its upper position. This also moves the hooked bracket 120 and, with it, the hooks 130, 131 upwards, so that they do not engage any more with the lower edges of the mounting holes 190 into which they protrude. In this idle position, the weight of the patch panel 10 is not supported by the rack via the mounting interface 100, and an installer needs to support it manually. The patch panel 10 can then be removed from its mounting location in the rack by pulling it out of the rack towards the front in a horizontal direction "H".

It will have become evident to the skilled person that the mounting interface 100 of the patch panel 10 according to the invention may be used on other types of rack-mountable telecommunications equipment. It may be used, for example, to mount cover panels or cable-management units in a rack.

The invention claimed is:

1. Telecommunications patch panel comprising a mounting interface for mounting the patch panel in a mounting location of a rack,
   wherein the mounting interface comprises fixation means for suspending and securely fixing the patch panel in the mounting location of the rack, characterized in that
   the fixation means is/are linearly movable, relative to the mounting interface, in a first direction (V, H) between a first position and a second position, and in a second direction (H, V) between the second position and a third position,
   wherein the fixation means is/are adapted to securely fix the patch panel to the rack by clamping a part of the rack between the fixation means and another part of the mounting interface.

2. Telecommunications patch panel according to claim 1, wherein the first position is an idle position, in which, when the patch panel is arranged in the mounting location, the fixation means is not engaged with the rack, such that the patch panel can be removed from the rack.

3. Telecommunications patch panel according to claim 1, wherein the second position is a suspension position, in which, when the patch panel is arranged in the mounting location, the fixation means is engaged with the rack such that the patch panel is suspended on the rack in the mounting location.

4. Telecommunications patch panel according to claim 1, wherein the third position is a fixation position, in which, when the patch panel is arranged in the mounting location, the fixation means securely fixes the patch panel in the mounting location of the rack.

5. Telecommunications patch panel according to claim 1, wherein the fixation means is/are movable manually.

6. Telecommunications patch panel according to claim 1, wherein the fixation means comprise(s) a hook-shaped part which is adapted to engage with an edge of an opening in the rack.

7. Telecommunications patch panel according to claim 1, wherein the mounting interface comprises a spring, and wherein the fixation means is movable against the force of the spring.

8. Telecommunications patch panel according to claim 1, wherein the first direction (H, V) is perpendicular to the second direction (V, H).

9. Telecommunications patch panel according to claim 1, wherein the mounting interface comprises a threaded element, and wherein the fixation means is movable in the first and/or in the second direction (V, H) by turning the threaded element.

10. Telecommunications patch panel according to claim 1, wherein the mounting interface further comprises positioning means for positioning the patch panel in a mounting location of the rack.

11. Telecommunications patch panel according to claim 1, wherein the mounting interface is adapted to suspend and securely fix the patch panel in a mounting location of a standardized 19-inch rack.

12. Method of mounting a telecommunications patch panel in a mounting location of a rack, comprising, in this sequence, the steps of
   a) providing a rack comprising a mounting location for a patch panel;
   b) providing a telecommunications patch panel according to claim 1;
   c) arranging the patch panel in the mounting location of the rack;
   d) moving the fixation means in the first direction (V, H) from the first position into the second position; and
   e) moving the fixation means in the second direction (H, V) from the second position into the third position,
   wherein the fixation means is/are adapted to securely fix the patch panel to the rack by clamping a part of the rack between the fixation means and another part of the mounting interface.

13. Method of mounting a telecommunications patch panel in a mounting location of a rack according to claim 12,
   wherein the second position is a suspension position, in which, when the patch panel is arranged in the mounting location, the fixation means is engaged with the rack such that the patch panel is suspended on the rack in the mounting location.

14. Method of mounting a telecommunications patch panel in a mounting location of a rack according to claim 12,
   wherein the third position is a fixation position, in which, when the patch panel is arranged in the mounting location, the fixation means securely fix(es) the patch panel in the mounting location of the rack.

* * * * *